United States Patent
Mano et al.

(10) Patent No.: US 8,730,647 B2
(45) Date of Patent: May 20, 2014

(54) PRINTED WIRING BOARD WITH CAPACITOR

(75) Inventors: Yasuhiko Mano, Ogaki (JP); Atsunari Yamashita, Ogaki (JP); Yoshitake Tsuchiya, Ogaki (JP); Takashi Kariya, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 852 days.

(21) Appl. No.: 12/203,340

(22) Filed: Sep. 3, 2008

(65) Prior Publication Data

US 2009/0200073 A1    Aug. 13, 2009

Related U.S. Application Data

(60) Provisional application No. 61/026,751, filed on Feb. 7, 2008.

(51) Int. Cl.
*H05K 1/16* (2006.01)
*H01G 4/228* (2006.01)
*H01L 23/522* (2006.01)

(52) U.S. Cl.
USPC .................. 361/306.3; 174/260

(58) Field of Classification Search
CPC .................. H05K 1/162; H01L 23/5222
USPC ........................... 361/306.3
See application file for complete search history.

(56) References Cited

U.S. PATENT DOCUMENTS

| 5,079,069 | A | | 1/1992 | Howard et al. |
|---|---|---|---|---|
| 5,155,655 | A | | 10/1992 | Howard et al. |
| 5,985,713 | A | * | 11/1999 | Bailey ............................. 438/241 |
| 6,198,617 | B1 | * | 3/2001 | Sun .............................. 361/301.4 |
| 6,201,271 | B1 | * | 3/2001 | Okutoh et al. ................. 257/295 |
| 6,342,734 | B1 | * | 1/2002 | Allman et al. ................. 257/758 |
| 6,344,413 | B1 | * | 2/2002 | Zurcher et al. ............... 438/678 |
| 6,893,935 | B2 | * | 5/2005 | Lachner ........................ 438/396 |
| 7,008,841 | B2 | * | 3/2006 | Kim et al. ..................... 438/250 |
| 7,151,288 | B2 | * | 12/2006 | Imai et al. ..................... 257/295 |
| 7,355,290 | B2 | * | 4/2008 | Shioga et al. ................. 257/790 |
| 7,480,150 | B2 | * | 1/2009 | Kariya et al. ................. 361/763 |
| 7,511,939 | B2 | * | 3/2009 | Wilson et al. .............. 361/306.2 |
| 7,614,142 | B2 | * | 11/2009 | Shioga et al. ................... 29/830 |
| 7,832,069 | B2 | * | 11/2010 | Shioga et al. ............... 29/25.42 |
| 7,836,567 | B2 | * | 11/2010 | Osaka et al. ................ 29/25.42 |
| 7,863,524 | B2 | * | 1/2011 | Shioga et al. ................. 174/260 |
| 8,536,463 | B2 | * | 9/2013 | Shoji et al. ................... 174/260 |
| 2001/0010955 | A1 | * | 8/2001 | Chen ............................. 438/239 |
| 2001/0038531 | A1 | * | 11/2001 | Asai et al. ..................... 361/794 |

(Continued)

FOREIGN PATENT DOCUMENTS

| JP | 08078283 | A | * | 3/1996 | ............. H01G 4/33 |
|---|---|---|---|---|---|
| JP | 08-250659 | | | 9/1996 | |
| JP | 2006-339296 | | | 12/2006 | |

*Primary Examiner* — Jeremy C Norris
*Assistant Examiner* — Nathan Milakovich
(74) *Attorney, Agent, or Firm* — Oblon, Spivak, McClelland, Maier & Neustadt, L.L.P.

(57) ABSTRACT

A printed wiring board includes a capacitor including a dielectric body having a first surface and a second surface, a first electrode provided on the first surface of the dielectric body, and a second electrode provided on the second surface of the dielectric body. The first electrode has an area facing and being smaller than the first surface of the dielectric body, and the second electrode has an area facing and being larger than the second surface of the dielectric body.

20 Claims, 13 Drawing Sheets

(56) References Cited

U.S. PATENT DOCUMENTS

| | | |
|---|---|---|
| 2004/0036551 A1* | 2/2004 | Hirabayashi .................. 333/101 |
| 2005/0006687 A1* | 1/2005 | Dirnecker et al. ............ 257/303 |
| 2005/0128720 A1* | 6/2005 | Croswell et al. ............. 361/763 |
| 2006/0002097 A1* | 1/2006 | Borland et al. ............... 361/763 |
| 2006/0183280 A1* | 8/2006 | Lee et al. ..................... 438/239 |
| 2006/0250749 A1* | 11/2006 | Kurihara et al. ........... 361/306.3 |
| 2006/0254812 A1* | 11/2006 | Borland et al. ............... 174/260 |
| 2006/0274476 A1* | 12/2006 | Cervin-Lawry et al. ... 361/306.3 |
| 2007/0057343 A1* | 3/2007 | Chinthakindi et al. ....... 257/532 |
| 2007/0065994 A1* | 3/2007 | Chen ............................. 438/149 |
| 2007/0202656 A1* | 8/2007 | Park et al. ..................... 438/393 |
| 2010/0044089 A1* | 2/2010 | Shibuya et al. ............... 174/260 |
| 2012/0228008 A1* | 9/2012 | Kondou et al. ............... 174/252 |

* cited by examiner

PRINTED WIRING BOARD WITH CAPACITOR

CROSS-REFERENCE TO RELATED APPLICATIONS

The present application claims the benefits of priority to U.S. Applications No. 61/026,751, filed Feb. 7, 2008. The contents of that application are incorporated herein by reference in their entirety.

BACKGROUND OF THE INVENTION

1. Field of the Invention

The present invention relates to a printed wiring board with a capacitor/capacitors.

2. Discussion of the Background

Printed wiring boards load and affix semiconductor integrated circuits (active components), etc., such as ICs and LSIs and electronic components (passive components) such as capacitors, inductances, and resistors, and provide electrical mutual connections among these. Thus, conventional printed wiring boards are formed with insulating resin substrates for affixing components and conductor circuits (including through-hole conductors and via conductors) formed on the surface of and in substrates for electrical mutual connections.

Of recent years, with the electronic devices having been made smaller, more highly densified, and more high-speed, what is desired has been to have passive components to be pre-loaded onto the printed wiring boards. The present application relates to a printed wiring board onto which a capacitor being one of such passive components has been pre-loaded.

A number of printed wiring board with a capacitor/capacitors as illustrated in FIG. 3 and FIG. 4 have conventionally been proposed.

SUMMARY OF THE INVENTION

According to one aspect of the present invention, a printed wiring board includes a capacitor including a dielectric body having a first surface and a second surface, a first electrode provided on the first surface of the dielectric body, and a second electrode provided on the second surface of the dielectric body. The first electrode has an area facing and being smaller than the first surface of the dielectric body, and the second electrode has an area facing and being larger than the second surface of the dielectric body.

According to another aspect of the present invention, a method of manufacturing a printed wiring board with a capacitor includes forming a first electrode by patterning on a surface of a core layer, placing a dielectric sheet having a high dielectric constant to entirely cover the surface of the core layer and the first electrode, thermosetting the dielectric sheet to form a dielectric layer having a high dielectric constant, forming a second electrode on a surface of the dielectric layer and a final shape of the dielectric layer having a high dielectric constant by patterning, injecting a liquid containing abrasives by blasting toward the dielectric layer with the second electrode as a shield such that the dielectric layer is shaped in a same form as the second electrode, and shaping the second electrode by patterning such that a final shape of the second electrode is formed.

According to yet another aspect of the present invention, a method of manufacturing a printed wiring board with a capacitor includes forming a first electrode by patterning on a surface of a core layer, adhering a dielectric sheet having a high dielectric constant by a screen printing method to entirely cover the surface of the core layer and the first electrode, heat-drying the dielectric sheet to form a dielectric layer having a high dielectric constant, forming a second electrode on a surface of the dielectric layer and a final shape of the dielectric layer having a high dielectric constant by patterning, injecting a liquid containing abrasives by blasting toward the dielectric layer with the second electrode as a shield such that the dielectric layer is shaped in a same form as the second electrode, and shaping the second electrode by patterning such that a final shape of the second electrode is formed.

According to still another aspect of the present invention, a method of manufacturing a printed wiring board with a capacitor includes forming a conductive layer for a first electrode on a surface of an insulating material, forming a dielectric layer by bonding a dielectric material in a sheet form or paste-printing a dielectric material on a surface of the conductive layer for the first electrode, forming a conductive layer for the second electrode on a surface of the dielectric layer, and shaping the dielectric layer such that an outer periphery portion of the dielectric layer sits outside an outer periphery portion of the second electrode.

According to still another aspect of the present invention, a method of manufacturing a printed wiring board with a capacitor includes laminating a copper foil and a dielectric sheet having a copper foil adhered to one face thereof onto a core substrate via an adhesive layer, forming a second electrode by patterning the copper foil of the dielectric sheet by lithography, shaping the dielectric sheet such that an outer periphery portion of the dielectric sheet sits outside an outer periphery portion of the second electrode, and forming a first electrode by patterning the copper foil in contact with the adhesive layer by lithography.

According to still another aspect of the present invention, a method of manufacturing a printed wiring board with a capacitor includes bonding a dielectric sheet having a copper foil adhered to both faces thereof onto a surface of an interlaminar insulating layer on a core substrate, forming a second electrode by patterning the copper foil of the dielectric sheet not in contact with the interlaminar insulating layer by lithography, shaping the dielectric sheet such that an outer periphery portion of the dielectric sheet sits outside an outer periphery portion of the second electrode, and forming a first electrode by the copper foil of the dielectric sheet in contact with the interlaminar insulating layer by lithography.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a sectional view in the thickness direction of one example of a printed wiring board with a capacitor/capacitors wherein a capacitor is built in;

DETAILED DESCRIPTION OF THE EMBODIMENTS

Figure 1:
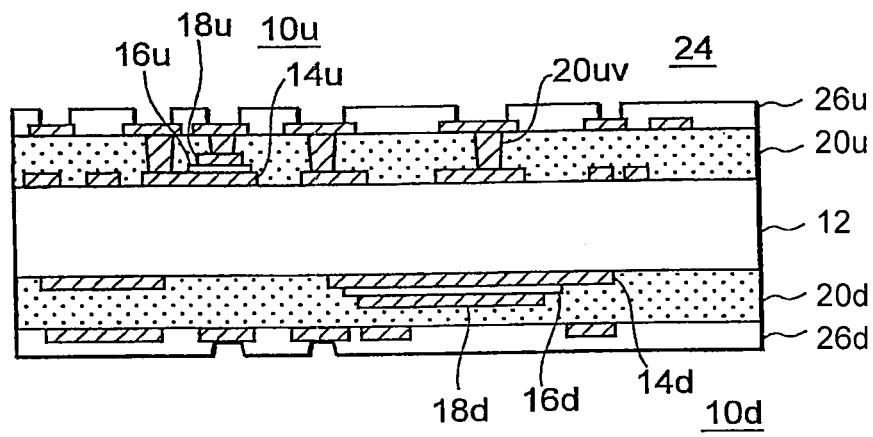

The embodiments will now be described with reference to the accompanying drawings, wherein like reference numerals designate corresponding or identical elements throughout the various drawings.

FIG. 1 is a sectional view in the thickness direction of one example of a printed wiring board with a capacitor/capacitors with capacitors ($10u$, $10d$) built-in. As to this printed wiring board 24, interlaminar insulating layers ($20u$, $20d$) are formed on the upper face and on the lower face of a core layer 12, for example, and via conductors ($20uv$) are formed at the predetermined locations. Further, on the upper face of the interlaminar insulating layer ($20u$) and on the lower face of ($20d$), solder resist layers (or protective films) ($26u$, $26d$) are formed respectively. As to this printed wiring board 24, there is provided a capacitor $10u$ comprising a lower electrode $14u$, a dielectric layer ($16u$), and an upper electrode ($18u$) on the upper face of the core substrate (core layer) 12.

Further, as to this printed wiring board 24, there is provided a capacitor ($10d$) comprising a lower electrode ($14d$), a dielectric layer ($16d$), and an upper electrode ($18d$) on the lower face of the core substrate 12. In addition, in FIG. 1, while one layer of each of the interlaminar insulating layers ($20u$, $20d$) is illustrated, it is not limited to this. As to interlaminar insulating layers ($20u$, $20d$), layers in any given number may be formed. And, the capacitors ($10u$, $10d$) may be provided, not on the core substrate 12, but on the interlaminar insulating layers ($20u$, $20d$), as described below.

Figure 2:
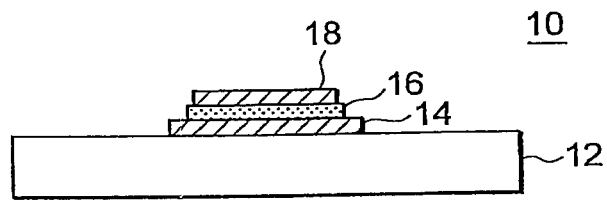
FIG. 2 is a sectional view in the thickness direction of one example of a capacitor to be built into a printed wiring board pertaining to the present invention.

FIG. 2 is a sectional view in the thickness direction of one example of the capacitor 10 to be built into the printed wiring board 24 pertaining to the present embodiment. This capacitor 10 has a lower electrode 14 formed on the surface of the core layer 12 or of the interlaminar insulating layer 20 of the printed wiring board 24, a dielectric having a high dielectric constant 16 formed on the upper face of the lower electrode, and the upper electrode 18 formed on the upper face of the dielectric having a high dielectric constant. While one capacitor 10 with respect to the core layer or the interlaminar insulating layer is herein disclosed, the number of capacitors could be any.

The lower electrode 14 and the upper electrode 18 are each made of a metal, typically of copper.

The dielectric having a high dielectric constant 16 is about 1 to 2 microns (μm) in finished thickness, and made of a material having a specific dielectric constant being greater than 10 (∈r>10). Specifically, a material for the dielectric having a high dielectric constant 16 may be a composite of a ferroelectric filler such as barium titanate ($BaTiO_3$) or strontium titanate ($SrTiO_2$) and a resin, for example. The dielectric having a high dielectric constant 16 can be obtain in the market as a dielectric having a high dielectric constant in a sheet. In addition, the dielectric having a high dielectric constant 16 may be formed out of a paste for screen printing.

Here, the features of the capacitor 10 pertaining to the present embodiment will be described while being compared to the conventional capacitors 100, 101.

Figure 3:
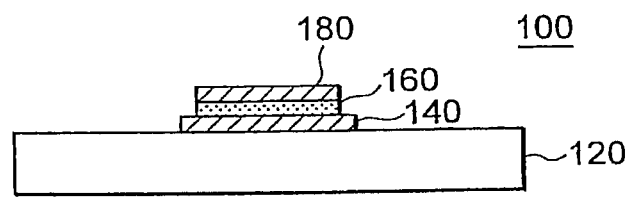
FIG. 3 is a sectional view in the thickness direction of one example of a capacitor to be built into a conventional printed wiring board.

FIG. 3 is a sectional view in the thickness direction of one example of the capacitor 100 to be built into a conventional printed wiring board. As illustrated in the drawing, the dielectric having a high dielectric constant 160 and the upper electrode 180 are shaped to have the same area in this capacitor 100. Namely, the outer periphery portions of the dielectric having a high dielectric constant 160 and of the upper electrode 180 match.

Figure 4:
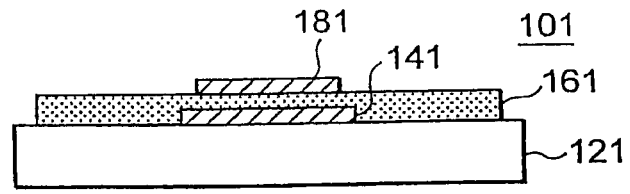
FIG. 4 is a sectional view in the thickness direction of one example of a capacitor to be built into yet another conventional printed wiring board.

Further, a capacitor 101 to be built into a printed wiring board as illustrated in FIG. 4 has also been known. Since the external shape of the dielectric having a high dielectric constant 161 is not shaped in this capacitor 101, the dielectric having a high dielectric constant 161 stretches out in the horizontal direction than both electrodes 141, 181. Necessarily, such a capacitor 101 is relatively poor in dielectric dissipation factor (tan δ) property and is relatively large in power loss.

As opposed to these conventional capacitors 100, 101, as to the capacitor 10 pertaining to the present embodiment illustrated in FIG. 2, the external shape of the dielectric having a high dielectric constant 16 is shaped. Further, the area of the dielectric having a high dielectric constant 16 is relatively large as compared to the area of the upper electrode 18. Namely, the outer periphery portion of the dielectric having a high dielectric constant 16 protrudes more outwardly than the outer periphery portion of the upper electrode 18. In other words, the outer periphery portions from the upper electrode 18 to the dielectric having a high dielectric constant 16 are formed in a stepped shape sequentially toward the outside. Further, the area of the lower electrode 14 is relatively large as compared to the area of the dielectric having a high dielectric constant 16. Namely, the outer periphery portion of the lower electrode 14 protrudes more outwardly than the outer periphery portion of the dielectric having a high dielectric constant 16. In other words, the outer periphery portions from the dielectric having a high dielectric constant 16 to the lower electrode 14 are formed in a stepped shape sequentially toward the outside.

Further, while a detailed description is given later, as to the capacitor 10 pertaining to the present embodiment, the feature is that when the dielectric having a high dielectric constant 16 is shaped, the external shape thereof is formed with a high precision since the outer periphery of the upper electrode 18 does not become eroded. Accordingly, the feature is that the capacitor 10 pertaining to the present embodiment in FIG. 2 is, as compared to the conventional capacitor 100 in FIG. 3, relatively small in deviation (dispersion) of the actual electrostatic capacity to the target electrostatic capacity.

Next, the reason for such features to have been able to be realized will be described.

Figure 6:
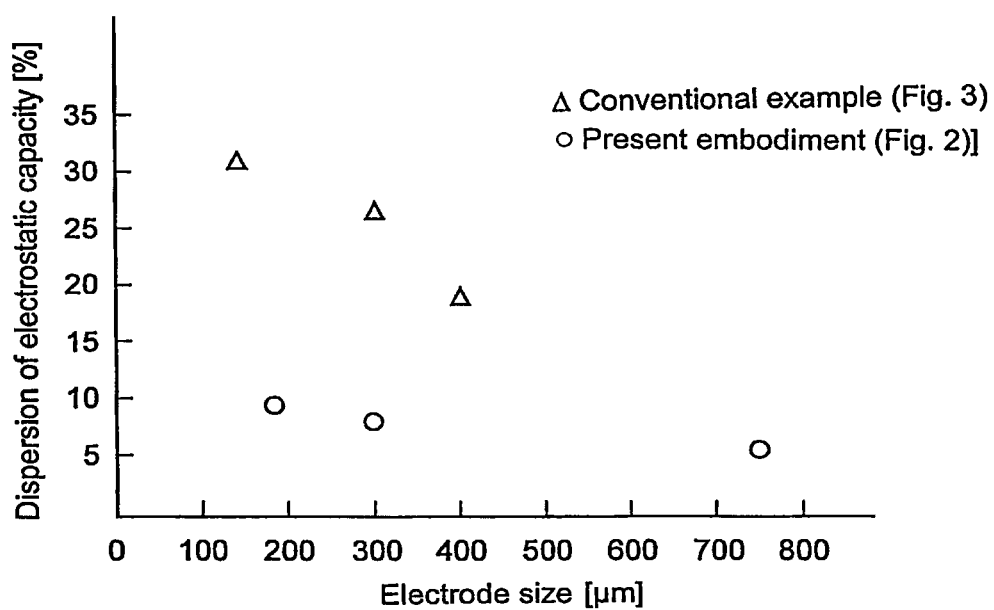
FIG. 6 is a graph illustrating the properties of a capacitor built into a printed wiring board pertaining to the present embodiment as compared to those of a conventional capacitor.

The present inventors had held it a problem that, with respect to a capacitor built into a printed wiring board, the deviation (dispersion) of the actual electrostatic capacity to the target electrostatic capacity with respect to the conventional capacitor 100 in FIG. 3 is relatively large (refer to the conventional example with the symbol Δ in FIG. 6). They ascertained the cause for this, by looking into it microanalytically, to be that the external shape of the upper electrode 180 was shaped with a high precision. Further, they ascertained the cause for it to be with the manufacturing step, in particular, with the shaping process for the dielectric having a high dielectric constant 160.

Figure 5:
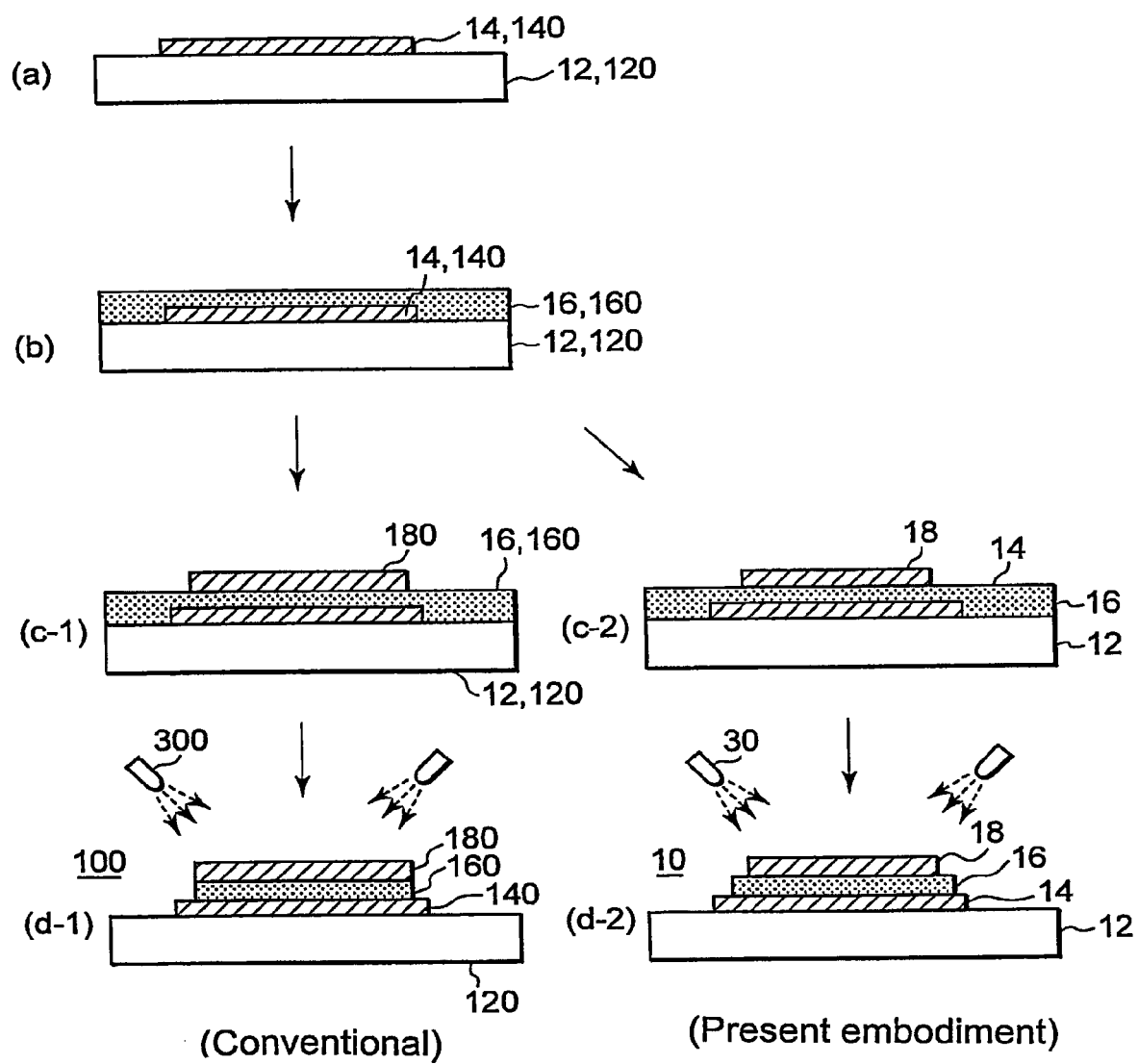
FIG. 5 is a conceptual rendering describing a method of forming a capacitor pertaining to the present embodiment illustrated in FIG. 2 while being compared to a conventional method of forming a capacitor illustrated in FIG. 3.

As to FIG. 5, they are conceptual renderings describing a method of forming a capacitor 10 pertaining to the present embodiment illustrated in FIG. 2 (the right-hand portion of the drawings) while being compared to a method of forming a conventional capacitor 100 illustrated in FIG. 3 (the left-hand portion of the drawings).

A method of forming the conventional capacitor 100 is as follows.

As illustrated in (a), a lower electrode 140 is formed by patterning on the upper face of a core substrate 120.

As illustrated in (b), a dielectric sheet having a high dielectric constant 160 is placed to cover the entirety of the upper faces of the core substrate 120 and the lower electrode 140, which is thermoset. In addition, a dielectric paste having a high dielectric constant may be screen-printed and heat-dried.

As illustrated in (c-1), an upper electrode 180 is formed on the upper face of the dielectric having a high dielectric constant 160 with a high precision with a semi-active method, for example such that it is in its final shape.

As illustrated in (d-1), a liquid containing abrasives is injected out of a nozzle 300 toward of the dielectric having a high dielectric constant 160 by blasting, for example, with the upper electrode 180 being used as a mask such that the dielectric having a high dielectric constant 160 is shaped such that it would match the outer periphery portion of the upper electrode 180.

Blasting is one of mechanical washing methods, and is a method whereby a washing solution containing abrasives is spray-injected under a high pressure. Here, abrasives are injected against the upper electrode 180 and the dielectric having a high dielectric constant 160 by blasting such that the portion of the dielectric having a high dielectric constant 160 sticking out of the upper electrode 180 is mechanically removed.

The present inventors discovered, by looking into it microanalytically, that the outer periphery portion of the upper electrode 180 was damaged during the operation of the dielectric layer shaping process by blasting, etc. The present inventors propose a method of forming the capacitor 10 (refer to FIG. 2) pertaining to the present embodiment to avoid this damage to the outer periphery portion of the upper electrode 180.

As to (a) and (b), they are the same as a method of forming the capacitor 100 illustrated in FIG. 3.

As illustrated in (c-2), the upper electrode 18 is formed by patterning such that it renders itself as the final shape of the dielectric having a high dielectric constant 16.

As illustrated in (d-2), a liquid containing abrasives is injected out of a nozzle 30 toward the dielectric having a high dielectric constant 16 such that the dielectric having a high dielectric constant 16 is shaped such that the outer periphery portion of the dielectric having a high dielectric constant 16 stick out of the outer periphery portion of the upper electrode 180.

Here, in order to form a capacitor 10 having a good precision capacitance, steps such as (1) the dielectric having a high dielectric constant 16 being shaped in an appropriate size, (2) the upper electrode 18 being protected with an appropriate means such that the damage to the outer periphery portion thereof in particular is prevented when the dielectric having a high dielectric constant 16 is shaped by blasting, for example, (3) the upper electrode 18 being shaped with a high precision, and (4) the lower electrode 14 being shaped with a high precision are taken. When it comes to a capacitor to be built into a printed wiring board pertaining to the present embodiment, the dispersion in electrostatic capacity is controlled by one or more of these steps (1) through (4) being employed. As to a method of forming the capacitor 10, a detailed description will be given in conjunction with the methods of manufacturing a printed wiring board with a capacitor/capacitors (the first through fourth methods of manufacture).

FIG. 6 is a graph illustrating the property of the capacitor 10 to be built into a printed wiring board pertaining to the present embodiment (refer to FIG. 2) as it is compared to that of the conventional capacitor 100 (refer to FIG. 3). Here, the shapes of the upper electrodes 18, 180 are each rectangular. The horizontal axis of the graph shows the length of one side of the rectangular upper electrodes 18, 180 in [μm] unit while the vertical axis shows the dispersion (deviation) to the target electrostatic capacity in percentage [%] unit. The capacitor pertaining to the present embodiment is indicated with a symbol "○" while the conventional capacitor 100 with a symbol "Δ."

From the graph, the electrostatic capacity of the conventional capacitor 100 shows a dispersion of ±about 20% to 32% to the target values. As opposed to this, the electrostatic capacity of the capacitor 10 pertaining to the present embodiment shows a dispersion of within ±about 10% to the target values, presenting a very good electrostatic capacity to the target values.

With the formation of the conventional capacitor 100, the end portion of the upper electrode 180 is damaged due to blasting, by looking into it microanalytically. Conversely, when it comes to the capacitor 10 pertaining to the present embodiment, the upper electrode 18 is formed with a high precision by patterning by a semi-active method, for example. Further, a protective means is taken so as for the upper electrode 18 to be not damaged when blasting is performed for the shaping of the dielectric having a high dielectric constant 16. Accordingly, the external shape of the upper electrode 18 is shaped with a high precision, and not damaged subsequently. It is determined that while this results in a relatively large dispersion in terms of the electrostatic capacity of the capacitor 100, the electrostatic capacity of the capacitor 10 conversely results in being relatively small in dispersion.

Further, upon the capacitor 10 pertaining to the present embodiment (refer to FIG. 2) and a conventional, another capacitor 101 (refer to FIG. 4) being compared, the conventional capacitor 101 presents a problem of having a high dielectric dissipation factor due to the dielectric having a high dielectric constant 161 not being shaped and spreading out greatly in a horizontal direction. However, the capacitor 10 pertaining to the present embodiment presents little problem relating to a dielectric dissipation factor as the dielectric having a high dielectric constant 16 having been shaped.

Typical methods of manufacturing a printed wiring board with a capacitor/capacitors by a build-up method utilizing a core layer (first through fourth methods of manufacture) will briefly be described.

First Method of Manufacture:

One example of a method of manufacturing a printed wiring board provided with a capacitor on a core substrate will be described as the first method of manufacture.

Figure 7A:
FIG. 7A through FIG. 7P are views describing one example of a method, as the first method of manufacture, of manufacturing a printed wiring board provided with a capacitor on a core substrate.

As illustrated in FIG. 7A, a core substrate 12 is prepared. This core substrate 12 is manufactured by a plating through-hole method with the use of a fiber fabric epoxy resin dual-sided copper-clad laminate board or a glass fabric high heat-resistant resin dual-sided copper-clad laminate board. The core substrate 12 may be one sheet of a dual-sided copper-clad laminate board or a multilayer board, where with the use of sheets of dual-sided copper-clad laminate boards there are formed inner layer circuits, which is thermocompression-bonded with a prepreg.

Figure 7B:
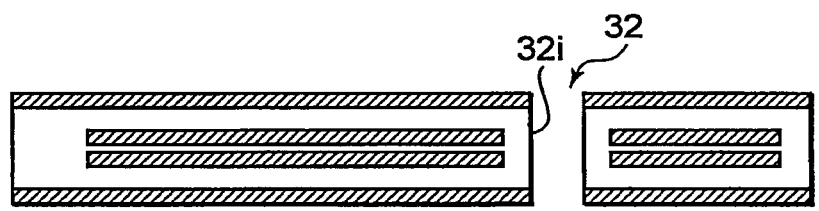

As illustrated in FIG. 7B, holes 32 are made with a drill, etc., for example, in the core substrate 12. Then, the entirety of the surfaces of the core substrate 12 including the inner walls (32$i$) of the hole (not illustrated) is electroless copper-plated, and, further, electrolytic copper-plated (not illustrated).

Figure 7C:
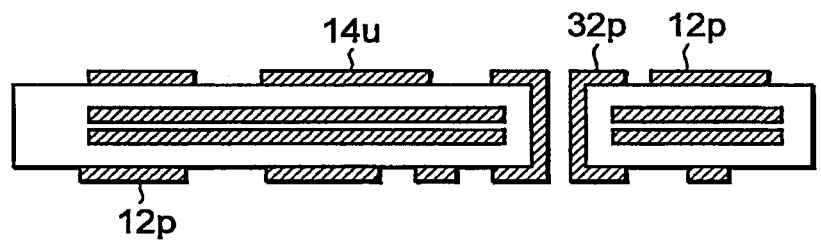

A method of forming the capacitor (10$u$) to be provided on the core substrate is herein described. As illustrated in FIG. 7C, these plated layers are patterned by a predetermined method such as a tinting method using a dry film. This results in plated through-holes (32$p$) being formed in the core substrate 12 and conductor circuits (12$p$) including the lower electrode (14$u$) of the capacitor (10$u$) on the surface of the core substrate.

Figure 7D:
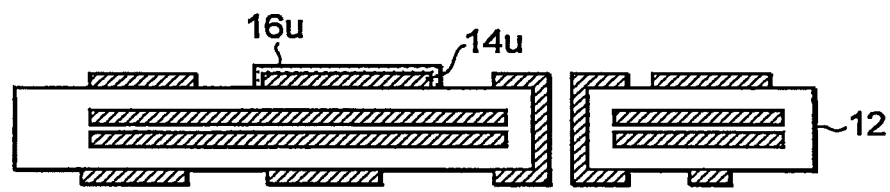

As illustrated in FIG. 7D, a dielectric having a high dielectric constant (16$u$) is formed such that it covers the lower electrode (14$u$) formed on the core substrate. Specifically, the dielectric having a high dielectric constant (16$u$) is formed by a dielectric material having a high dielectric constant in a sheet form (not illustrated), for example, is placed to cover the lower electrode (14$u$) only or the entirety of the surfaces of the lower electrode (14$u$) and the core substrate 12, which is thermoset. Or, this dielectric material having a high dielectric constant (16$u$) may be formed with the use of a screen printing method in lieu of a dielectric material having a high dielectric constant in a sheet form.

Figure 7E:
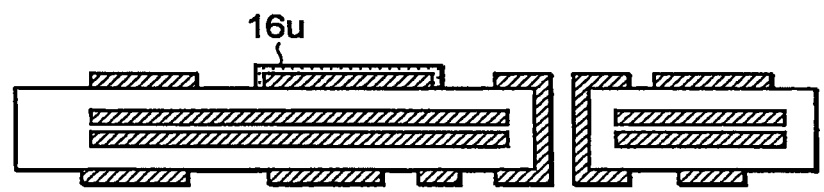
Figure 7F:
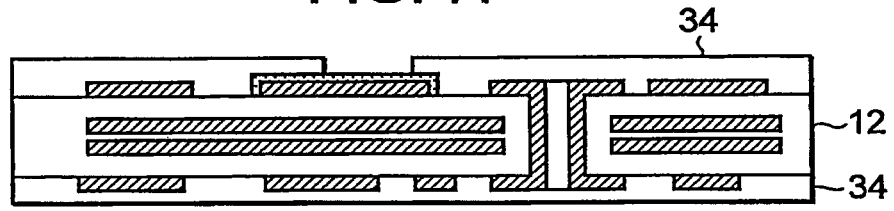

Then, as illustrated in FIG. 7E, the surfaces of the dielectric material having a high dielectric constant (16$u$) and the core substrate 12 are electroless copper-plated (not illustrated). Further, as illustrated in FIG. 7F, a dry film resist is bonded by thermocompression bonding with a roller laminator on the dielectric material having a high dielectric constant and the substrate 12, which is exposed and developed with the use of a film mask to form a resist pattern 34.

Figure 7G:
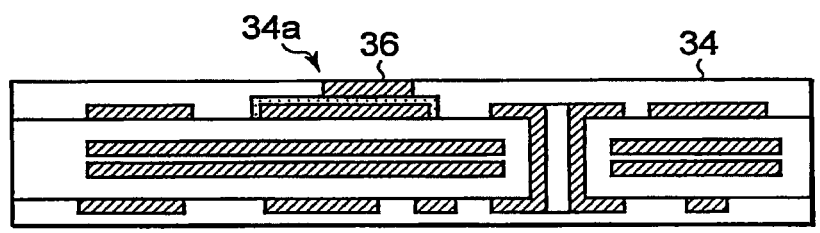
Figure 7H:
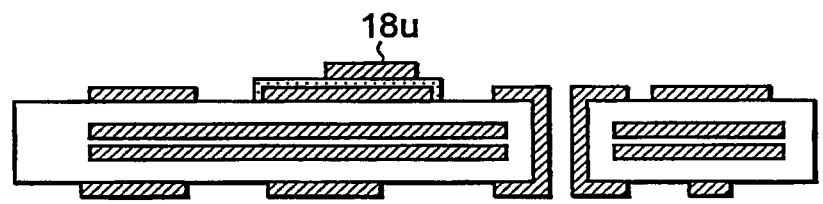

Next, as illustrated in FIG. 7G, electrolytic copper plating 36 is deposited in the openings (34$a$) in the resist pattern 34 with the electroless copper-plating (not illustrated) as an electrode. Then, as illustrated in FIG. 7H, the resist pattern 34 is stripped and the electroless copper-plating (not illustrated) present underneath this resist pattern is removed by quick etching. The formation of an upper electrode (18$u$) with such a semi-additive method allows a high formation precision of the upper electrode to be secured.

Figure 7I:
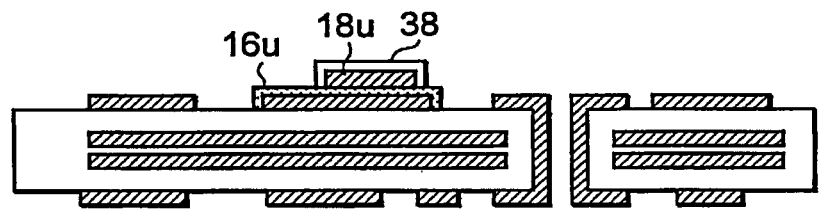
Figure 7J:
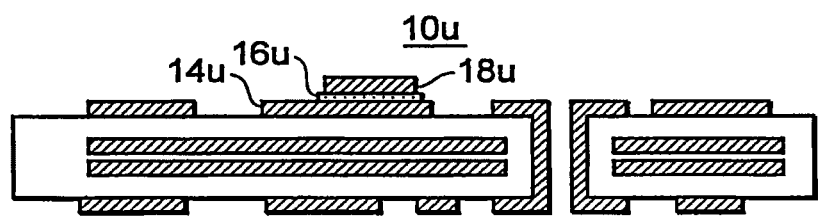

Next, as illustrated in FIG. 7I, with the same technique as in the above description, the resist pattern 38 is formed such that it covers the entirety of the upper electrode (18$u$). Specifically, a dry film resist is patterned such that the outer periphery portion of the resist pattern 38 is disposed outside the outer periphery portion of the upper electrode (18$u$). This being as is, the dielectric having a high dielectric constant (16$u$) sticking out of the resist pattern 38 is removed by a mechanical washing method such as blasting, for example. Specifically, an abrasive grain solution composed of silicon dioxide ($SiO_2$) in several μm and water is injected out of a nozzle, for example, the outer periphery portion of the dielectric layer (16$u$) is removed and shaped with the use of a resist pattern as a mask. Then, as illustrated in FIG. 7J, a desired dielectric layer pattern (16$u$) is formed by the resist pattern having been removed.

Here, during the step in FIG. 7C for capacitor formation, the lower electrode (14$u$) is formed with a high precision with use of a dry film. Further, during the step in FIG. 7G, the upper electrode (18$u$) is formed with a high precision with a semi-active method, for example, being employed. Further, during the steps for FIG. 7I through 7J, the end portion of the external shape of the dielectric having a high dielectric constant 16$u$ is shaped with the use of the resist pattern 38. Further, during the shaping of the dielectric having a high dielectric constant (16$u$), the damage to the outer periphery portion of the upper electrode 18 by blasting, for example, is prevented with a suitable resist pattern 38 to protect the upper electrode (18$u$) being employed. The employment of one or more of these means a capacitor (10$u$) with a good precision capacitance can be formed.

In addition, in shaping the dielectric (16$u$), the ratio of the area of the upper electrode (18$u$) to the area of the dielectric is preferably 30 to 95% to secure the capacitance of the capacity. With an area ratio being as such, when the area of the dielectric (16$u$) is shaped such that it is larger with respect to the upper electrode, the resist pattern 38 used as the mask during shaping is necessarily larger with respect to the upper electrode. With the presence with this relatively large resist pattern 38, the outer periphery portion of the dielectric (16$u$) is sufficiently protected during blasting, for example, such that the damage to it can be controlled with a high probability.

Figure 7K:
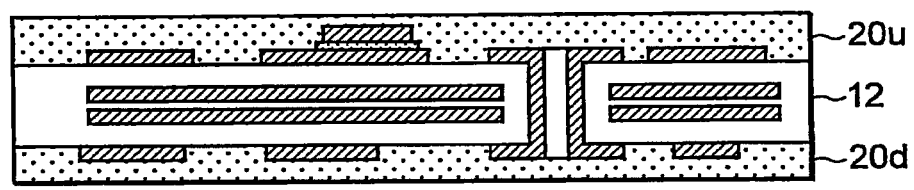

Continuing on, the formation of build-up layer will be described. As illustrated in FIG. 7K, on the core substrate 12 and on the upper face of the capacitor (10$u$) there are formed interlaminar insulating layers (20$u$, 20$d$) respectively. These interlaminar insulating layers (20$u$, 20$d$) are formed by a method of coating a liquid interlaminar insulating material or by a laminate method whereby a liquid interlaminar insulating material in a film form is heated and compression-bonded in vacuum.

Figure 7L:
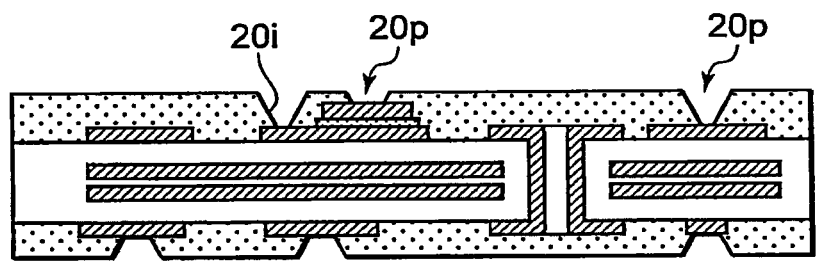
Figure 7M:
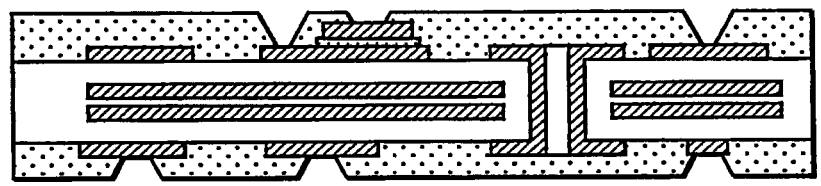

As illustrated in FIG. 7L, a laser beam is irradiated at the interlaminar insulating layers (20$u$, 20$d$) to form openings (20$p$) for via holes. And, as illustrated in FIG. 7M, electroless copper-plating (not illustrated) is deposited on the surfaces of the interlaminar insulating layers (20$u$, 20$d$) including the inner wall faces (20$i$) of the openings (20$p$) such that they become conductive. At that time, it is preferred that the surfaces of the interlaminar insulating layers (20$u$, 20$d$) are roughened (not illustrated) to enhance the adhesion of the plating onto the surfaces of the interlaminar insulating layers (20$u$, 20$d$).

Figure 7N:
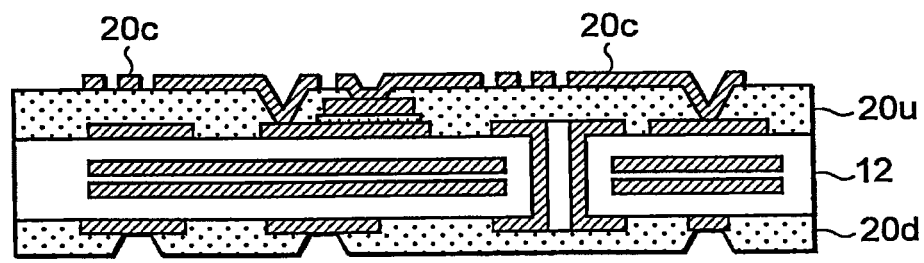

As illustrated in FIG. 7N, a conductor pattern (20$c$) on the surface side of the printed substrate is formed. As to the formation of the conductor pattern, a resist pattern is formed on the electroless copper-plating and an electrolytic copper-plating is deposited in the opening portions of that resist pattern. Then, the resist pattern is stripped and the electroless copper plating underneath the resist pattern is removed by quick etching (a semi-additive method). Or the entirety of the surface of the electroless copper-plating is electrolytic copper-plated, and on these copper-plated upper faces an etching resist is formed, and then a conductor pattern is formed by etching (a subtructive method). Or, methods other than these semi-additive method and subtractive method, such as a full-additive method, for example, may be used.

Figure 7O:
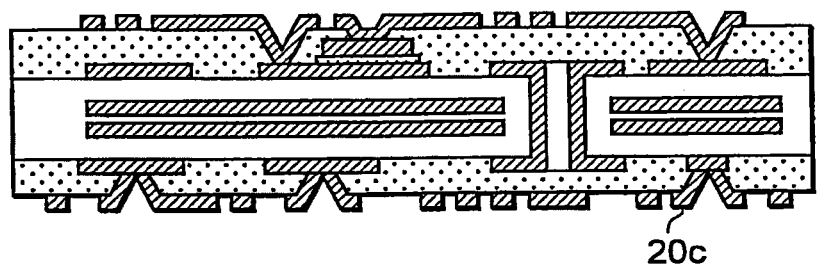

As illustrated in FIG. 7O, as with the method described in conjunction with FIG. 7N, a conductor pattern (20c) on the back face side of the printed substrate is formed.

Figure 7P:
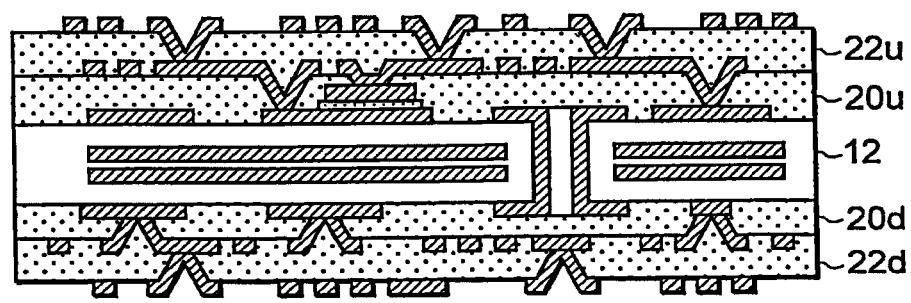

As illustrated in FIG. 7P, another pair of build-up layers (22u, 22d) are further formed on the front face side and on the back face side of the printed substrate by another round of steps in conjunction with FIG. 7K through FIG. 7O being further repeated. In addition, the number of build-up layers is not limited to this, and it can be suitably changed as desired. Further, a solder resist layer (not illustrated) may be formed as the outermost layer of the build-up layers as desired.

As described above, a printed wiring board provided with the capacitor 10 on the core substrate 12 can be manufactured.

Second Method of Manufacture:

As the second method of manufacture, one example of a method of manufacturing a printed wiring board provided with a capacitor on an interlaminar insulating layer (22u) on a core layer 12 will be described.

Figure 8A:
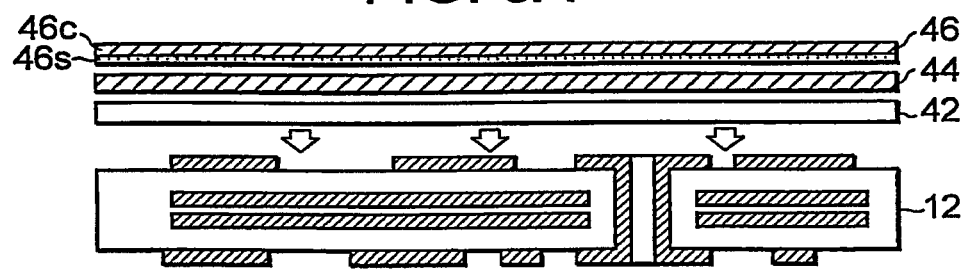
FIG. 8A through FIG. 8G are views describing one example of a method, as the second method of manufacture, of manufacturing a printed wiring board provided with a capacitor on a interlaminar insulating layer $22u$ on the core substrate 12.

As illustrated in FIG. 8A, a prepreg 42 as an adhesive, a copper foil 44, and a dielectric sheet 46 having a copper foil attached to one side thereof are prepared for a core substrate 12. Here, in lieu of the copper foil and the dielectric having a copper foil attached to one side thereof, a dielectric sheet having a copper foil attached to both sides thereof may be used.

Figure 8B:
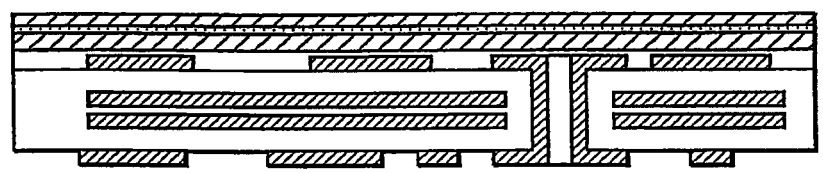

As illustrated in FIG. 8B, these prepreg, copper foil, and dielectric sheet having a copper foil attached to one side thereof are bonded onto the core substrate 12 with thermocompression bonding with the use of a vacuum press machine (not illustrated), for example.

In addition, as to the core substrate 12, it already has formed, as necessary, inner layer circuits, outer layer circuits, and through holes by the steps described in conjunction with FIG. 7A through FIG. 7C. In addition, the prepreg 42 is thermoset to form an interlaminar insulating layer (20u).

Figure 8C:
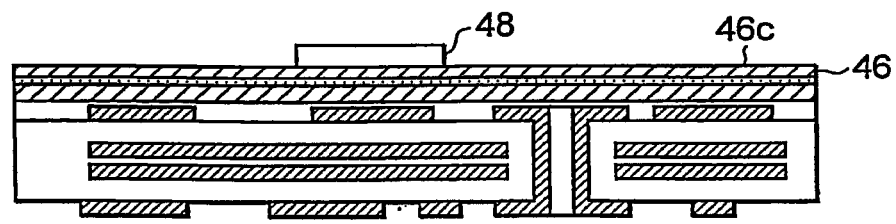

Here, a method of forming the capacitor 10u to be provided on the interlaminar insulating layer (20u) will be described. As illustrated in FIG. 8C, a dry film resist is bonded by thermal compression bonding with a roll laminator, which is exposed and developed with the use of a film mask to form a resist pattern 48.

Figure 8D:
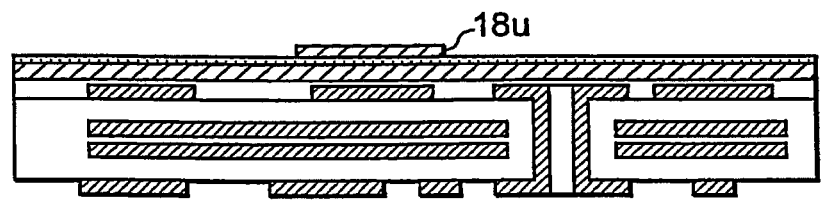

As illustrated in FIG. 8D, using this resist pattern as a mask, the outer layer copper foil (46c) is etched with a ferric chloride solution, for example. Then, the resist pattern is stripped to form an upper electrode 18u in a desired shape.

Figure 8E:
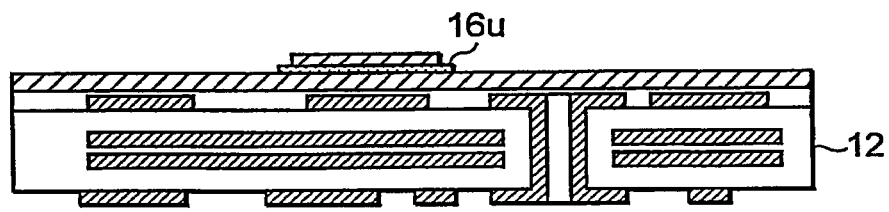

As illustrated in FIG. 8E, a dielectric having a high dielectric constant (16u) formed out of a dielectric sheet (46s) is shaped in a predetermined size. Specifically, as to the method of shaping this dielectric having a high dielectric constant, the entirety of an upper electrode is coated with the use of a resist pattern matching the size of the external shape of the dielectric having a high dielectric constant, as described in conjunction with the steps for FIG. 7I through FIG. 7J under the first method of manufacture. Then, using this resist pattern as a mask, the dielectric having a high dielectric constant sticking out of the resist pattern is removed with a mechanical washing method such as blasting, for example. Then, this resist pattern is removed.

Figure 8F:
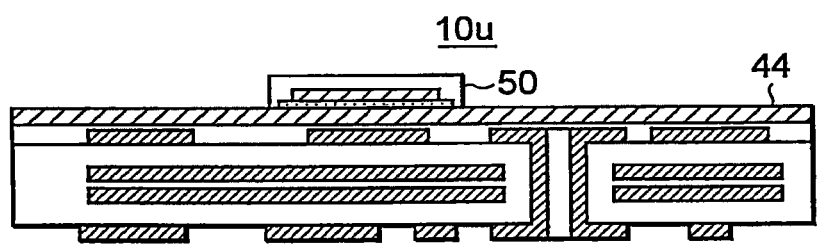

As illustrated in FIG. 8F, a liquid resist or a dry film resist is added, by a screen printing, for example, onto the copper foil 44 including the capacitor 10, which is exposed and developed with the use of a film mask to form a resist pattern 50.

Figure 8G:
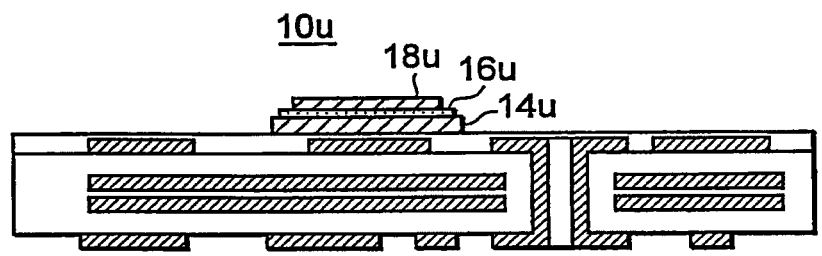

Next, as illustrated in FIG. 8G, the copper foil 44 is etched with a ferric chloride solution, for example, with the use of this resist pattern 50 as a mask. Then, by the resist pattern 50 being stripped, a lower electrode (14u) in a desired shape is formed.

Here, during the step in conjunction with FIG. 8C of forming a capacitor, the upper electrode (18u) is formed with a high precision with the use of a resist pattern, for example. Further, during the step in conjunction with FIG. 8E, likewise with the first method of manufacture, with the use of a resist pattern, for example, the end portion of the external shape of the dielectric having a high dielectric constant is shaped and concurrently the damage to the outer periphery portion of the upper electrode 18 by blasting is prevented. Further, during the steps in conjunction with FIG. 8F through 8G, the lower electrode (14u) is formed with a high precision with the use of a liquid resist, for example. With the employment of one or more of these means, a capacitor with a good precision capacitance can be formed.

The step of forming a build-up layer subsequent to this is the same as the steps indicated in conjunction with FIG. 7K through 7P under the first method of manufacture.

As described above, a printed wiring board provided with a capacitor on the interlaminar insulating layer constituting a build-up layer can be manufactured. In addition, the same printed wiring board may have the capacitor on the core substrate under the first method of manufacture already provided.

Third Method of Manufacture:

As to the third method of manufacture, a method of construction for providing a seed layer on a dielectric layer will be described, in relation to the first and second methods of manufacture. Under the first method of manufacture, a plated layer composed of electroless plating and electroplating is on a dielectric layer, while under the second method of manufacture, a copper foil is on a dielectric layer. As compared to the first and the second methods of manufacture, the third method of manufacture differs in that a seed layer composed of a metal is provided on a dielectric layer and an upper electrode is formed with a plated layer on the seed layer.

Figure 9A:
FIG. 9A through FIG. 9H are views describing, as the third method of manufacture, in relation to the first and the second methods of manufacture, a method of construction whereby a seed layer is provided on a dielectric layer.

While not illustrated in a figure, a prepreg 42 and a dielectric sheet having a copper foil attached to one face thereof are in advance prepared and bonded onto a core substrate 12 with thermocompression bonding with the use of a vacuum press machine, for example. While the dielectric having a copper foil attached to one face thereof 46 illustrated in FIG. 8A is composed of a copper foil (46c) on the upper face and a dielectric (46s) on the lower face, the dielectric having a copper foil attached to one face thereof 46 illustrated in FIG. 9A is composed of a dielectric (46s) on the upper face and a copper foil (46c) on the lower face, the front and the rear are in reverse. The dielectric (46s) of the dielectric sheet 46 forms the dielectric having a high dielectric constant (16u) after having been shaped.

As illustrated in FIG. 9A, a seed layer 52 composed of nickel (Ni), for example, is formed on the dielectric layer (46s) by various dry processes such as sputtering or an electroless plating method, for example. In addition, the material for the seed layer is not limited to this, and it may be another metal.

Figure 9B:
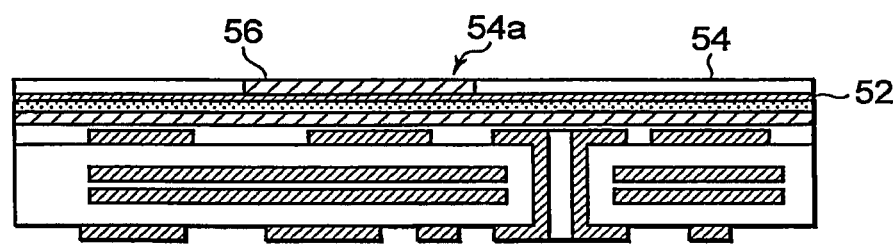

Here, a method of forming a capacitor 10 will be described. As illustrated in FIG. 9B, a dry film is bonded on the seed layer 52 by thermocompression bonding with a roll laminator, which is exposed and developed with the use of a film mask to form a resist pattern 54. Then, with the seed layer 52 as an electrode, an electrolytic copper-plated layer 56 is deposited in the opening portions of the resist pattern 54.

Figure 9C:
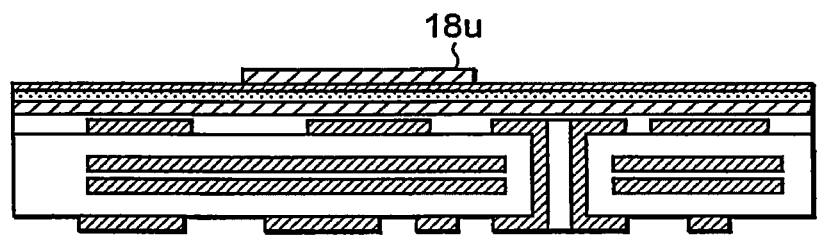

Then, as illustrated in FIG. 9C, the resist pattern 54 is stripped. Accordingly, an upper electrode 18u is formed.

Figure 9D:
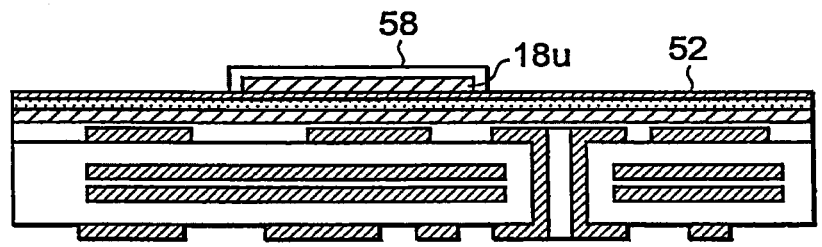
Figure 9E:
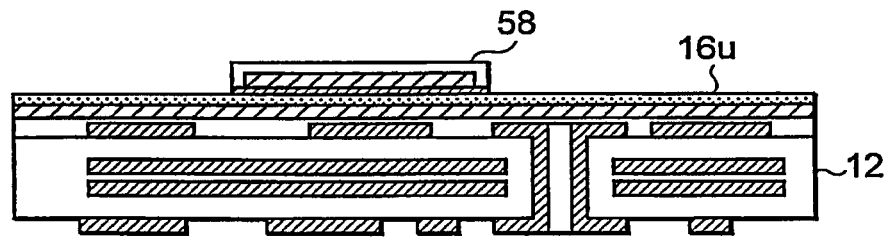

As illustrated in FIG. 9D, a dry film resist is bonded on the upper electrode 18u and on the seed layer 52 by thermocompression bonding with a roll laminator, which is exposed and developed with the use of a film mask to form a resist pattern 58. This resist pattern is set up such that the size thereof is that which matches the dielectric having a high dielectric constant to be ultimately formed. Then, as illustrated in FIG. 9E, with this resist pattern 58 used as a mask, the seed layer 52 is removed by etching.

Figure 9F:
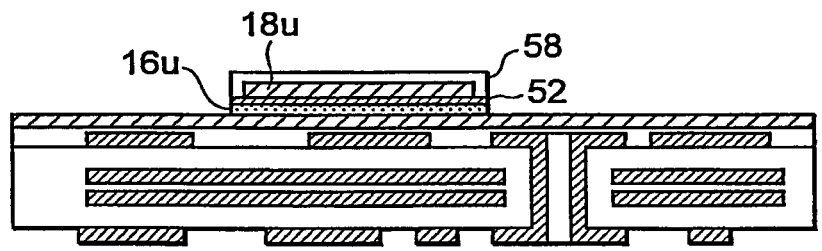

As illustrated in FIG. 9F, while the upper electrode 18u is being protected with the dry film 58, the dielectric having a high dielectric constant 16u sticking out of the resist pattern and the seed layer is removed with a mechanical washing method such as blasting while the resist pattern 58 and the seed layer 52 being used as a mask. Here, since the upper electrode (18u) is protected with the resist pattern 58, the damage to the outer edge portion of the upper electrode is controlled. Further, since the dielectric (16u) is protected with not only the resist pattern 58 but further the seed layer 52, the outer edge portion of the dielectric layer is shaped with further precision.

Figure 9G:
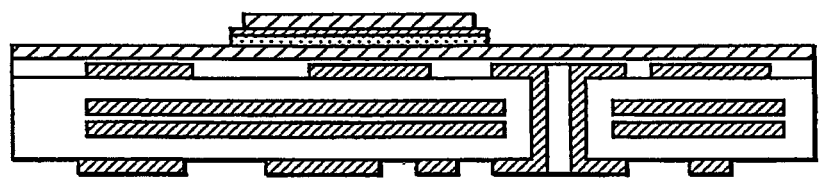
Figure 9H:
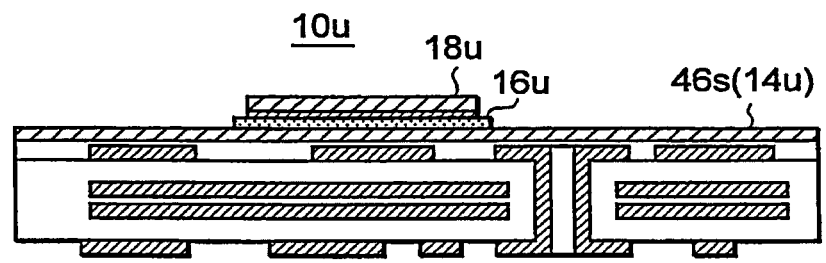

As illustrated in FIG. 9G, the resist pattern is stripped. Then, as illustrated in FIG. 9H, the protruding portion of the seed layer 52 sticking out of the upper electrode 18u is removed by etching with the upper electrode (18u) as a mask. Further, while not illustrated, likewise as with the steps in conjunction with FIG. 8F through 8G under the second method of manufacture, the lower electrode 14u is shaped with the use of a liquid resist or a dry film resist.

Here, during the steps in conjunction with FIG. 9B through 9F of capacitor formation, the upper electrode (18u) is formed with a high precision with the use of a dry film. Further, during the step for FIG. 9F, the upper electrode (18u) is protected with the resist pattern 58 during blasting, for example, to prevent the damage to the outer edge portion. Further, with the use of the resist pattern 58 and the seed layer 52, the external shape edge portion of the dielectric having a high dielectric constant (16u) is shaped. Further, while not illustrated, following the step for FIG. 9H, the lower electrode (14u) is formed with a high precision with the use of a liquid resist or a dry film resist. With one or more of these means being employed, a capacitor 10 with a good precision capacitance can be formed.

The step of forming the subsequent build-up layer is the same as the steps illustrated in conjunction with FIG. 7K through 7P under the first method of manufacture.

Fourth Method of Manufacture:

The fourth method of manufacture describes, in relation to the first through third methods of manufacture, a method of construction to provide an electroless metal plating layer such as nickel (Ni), for example, on the upper electrode for the protection of the upper electrode during blasting, for example, and for masking during the shaping of the dielectric layer. Under the first and second methods of manufacture, the protection of the upper electrode and the masking for the dielectric layer during the shaping are with a resist, and under the third method of manufacture, the protection of the upper electrode is with a resist pattern and the masking during the shaping of the dielectric layer are the seed layer in addition to the resist pattern. As compared to these first through third methods of manufacture, the fourth method of manufacture differs in that the protection of the upper electrode is with the resist pattern and the masking for the dielectric layer during the shaping is an electroless plating layer in addition to the resist pattern.

While not illustrated in the figure, a prepreg 42 and a dielectric having a copper foil attached to one side thereof 46 are prepared with respect to a core substrate 12, which are bonded with thermocompression bonding with the use of a vacuum press machine, for example. Then, an electroless copper-plating layer 60 is provided on the dielectric layer 46s. Further, the dry film is laminated, which is exposed and developed with the use of a film mask to form a resist pattern.

Figure 10A:
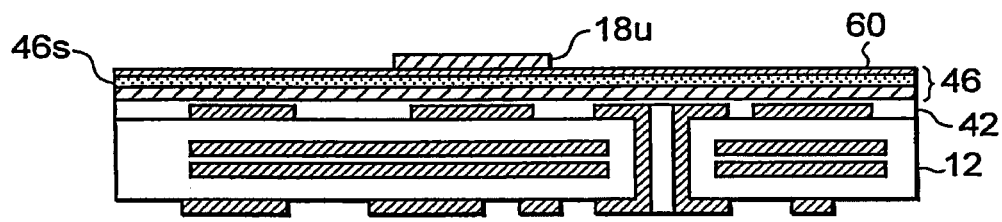
FIG. 10A through FIG. 10G are views describing, as the fourth method of manufacture, in relation to the first through third methods of manufacture, a method of construction whereby an electroless metal-plated layer is provided on an upper electrode for the protection of the upper electrode during blasting and for the masking of the dielectric layer during the shaping.

Here, a method of forming a capacitor 10 to be provided on the interlaminar insulating layer (22u) will be described. As illustrated in FIG. 10A, the opening portions in the resist pattern (not illustrated) are electrolytic copper-plated with the electroless copper-plating 60 as an electrode and the resist pattern is removed. As such, the upper electrode (18u) is formed.

Figure 10B:
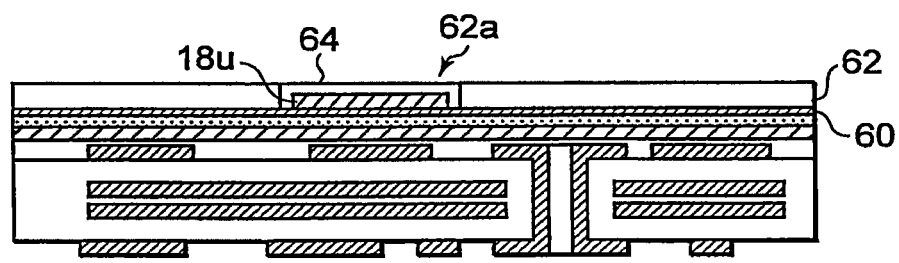
Figure 10C:
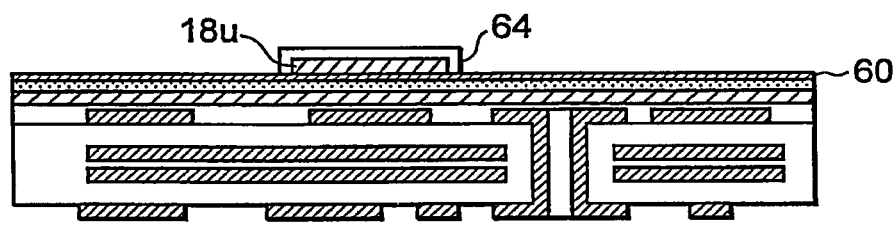

As illustrated in FIG. 10B, a dry film laminate is performed, which is exposed and developed with the use of a film mask to form a resist pattern 62 having opening portions (62a) matching the ultimate size of the dielectric having a high dielectric constant. Then, the opening portions (62a) in the resist pattern 60 are electrolytic copper-plated with nickel (Ni), etc., for example, with the electroless copper-plating layer 60 as an electrode. This electrolytic metal plating layer 64 is selected from among the metals having a selective etching property (Ni, etc., for example) as opposed to the upper electrode (18u) composed of copper. Then, as illustrated in FIG. 10C, the resist pattern 62 is removed.

Figure 10D:
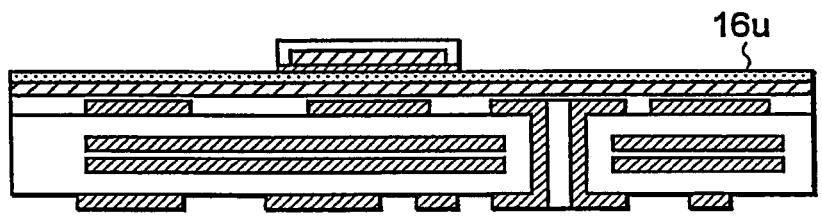

As illustrated in FIG. 10D, the electroless copper-plated layer 60 is removed by quick etching with the electrolytic metal plated layer 64 used as a mask. The electrolytic metal plated layer 64 cannot be etched with an etchant for copper since it is a metal having a selective etching property.

Figure 10E:
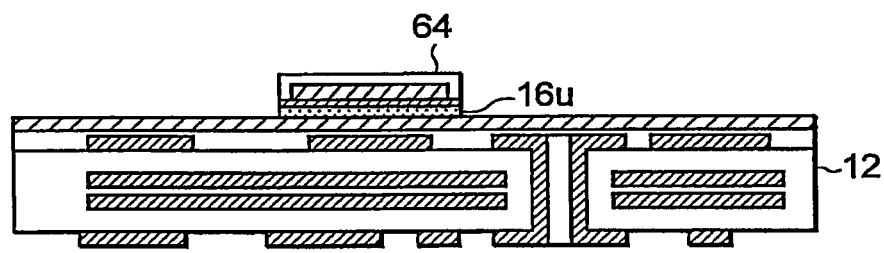
Figure 10F:
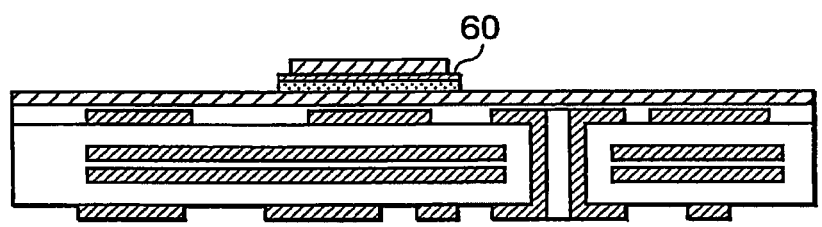
Figure 10G:
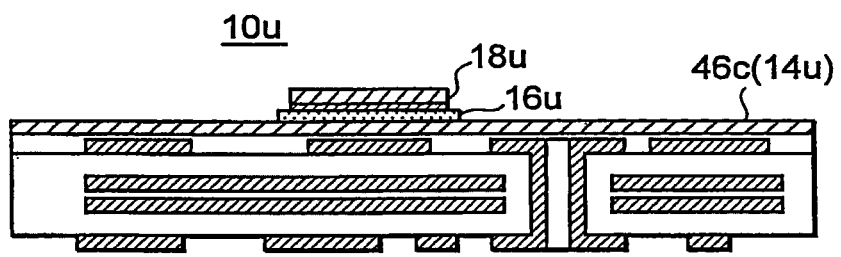

As illustrated in FIG. 10E, while the upper electrode 18u is being protected with the electrolytic metal-plated layer 64, the dielectric having a high dielectric constant (16u) sticking out of the electrolytic metal plated layer is removed with a mechanical washing method such as blasting while the electrolytic metal plated layer 64 being used as a mask. Then, as illustrated in FIG. 10F, the electrolytic metal plated layer 64 is removed with the use of an appropriate etchant. Since the electrolytic metal plated layer 64 is a metal having a selective etching property, the etchant for the electrolytic metal plated layer does not etch the upper electrode (18u). Further, as illustrated in FIG. 10G, the electroless copper-plated layer 60 present on the dielectric having a high dielectric constant sticking out of the upper electrode (18u) is removed with quick etching. Further, while not illustrated in a figure, with the use of a liquid resist or a dry film resist, the lower electrode (14u) is shaped, likewise with the steps in conjunction with FIG. 8F through 8G under the second method of manufacture.

Here, while not illustrated in figure, during the step prior to FIG. 10A for capacitor forming, the upper electrode (18u) is formed with a high precision with the use of the resist pattern. Further, during the step for FIG. 10E, the damage to the upper electrode 18 is prevented by blasting, for example, with the employment of an appropriate electrolytic metal-plated layer 64 protecting the upper electrode 18u during the shaping of the dielectric having a high dielectric constant (16u). Further, the external shape end portion of the dielectric having a high dielectric constant (16u) is shaped using this electrolytic metal-plated layer 64 as a mask. Further, while not illustrated in a figure, following the step for FIG. 10G, the lower electrode (14u) is formed with a high precision with the use of a liquid resist or a dry film resist. With the employment of one or more of these means, a capacitor with a good precision capacitance can be formed.

The subsequent step of forming a build-up layer is the same as the steps indicated in conjunction with FIG. 7K through 7P under the first method of manufacture.

In the above, the embodiments of a printed wiring board with a capacitor/capacitors pertaining to the present invention have been described. For the advantages and effects of the present embodiments, the following can be listed.

The feature of the capacitor 10 is that as compared to the area of the dielectric having a high dielectric constant 16, the area of the upper electrode is relatively small and the area of the lower electrode 14 is relatively large.

The feature of this capacitor 10 is that the external shape of the dielectric having a high dielectric constant 16 is shaped. Accordingly, the dielectric loss is relatively good.

Further, the feature of this capacitor 10 is that the external shape of the upper electrode 18 is formed with a high precision. Accordingly, the deviation (dispersion) of the actual electrostatic capacity to the target electrostatic capacity is relatively small.

Further, the feature of this capacitor 10 is that the upper electrode 18 is protected with an appropriate means when the external shape of the dielectric having a high dielectric constant 16 is shaped with the use of blasting, for example. Accordingly, the damage to the upper electrode 18, particularly to the outer edge portion, is controlled. Accordingly, the deviation (dispersion) of the actual electrostatic capacity to the target electrostatic capacity is relatively small.

Further, the feature of this capacitor 10 is that the external shape of the lower electrode 14 is formed with a high precision. Accordingly, the deviation (dispersion) of the actual electrostatic capacity to the target electrostatic capacity is relatively small.

While in the above, the embodiments of a printed wiring board with a capacitor/capacitors pertaining to the present invention have been described, these are examples and the present invention is not limited to these.

As to a printed wiring board with a capacitor/capacitors pertaining to the embodiments of the present invention, said capacitor/capacitors is/are provided with a dielectric, one electrode having a relatively small area as compared to the previously-described dielectric, and the other electrode having a relatively large area as compared to the previously-described dielectric.

Further, As to a method of manufacturing a printed wiring board with a capacitor/capacitors, said printed wiring board has a core layer and a build-up layer, said capacitor/capacitors having a lower electrode, a dielectric having a high dielectric constant, and an upper electrode, and a method of forming said capacitor/capacitors being such that the lower electrode is formed by patterning on the upper face of the previously-described core layer, that a dielectric sheet having a high dielectric constant is placed to cover the entirety of the upper face of the previously-described core layer and of the previously-described lower electrode, which is thermoset such that a dielectric layer having a high dielectric constant is formed, that the previously-described upper electrode is formed by patterning such that it would present itself as the final shape of the previously-described dielectric having a high dielectric constant, that a liquid containing abrasives is injected by blasting toward the previously-described dielectric having a high dielectric constant with the previously-described upper electrode as a shield such that said dielectric having a high dielectric constant is shaped in the external shape the same as said upper electrode, and that the previously-described upper electrode is shaped by patterning such that it would be in the final shape thereof.

Further, As to a method of manufacturing a printed wiring board with a capacitor/capacitors, said printed wiring board has a core layer and a build-up layer, said capacitor/capacitors having a lower electrode, a dielectric having a high dielectric constant, and an upper electrode, and a method of forming said capacitor/capacitors being such that the lower electrode is formed by patterning on the upper face of the previously-described core layer, that a dielectric paste having a high dielectric constant is adhered by a screen printing method to the entirety of the upper face of the previously-described core layer and the previously-described lower electrode which is heat-dried such that a dielectric layer having a high dielectric constant is formed, that the previously-described upper electrode is formed by patterning such that it would present itself as the final shape of the previously-described dielectric having a high dielectric constant, that a liquid containing abrasives is injected by blasting toward the previously-described dielectric having a high dielectric constant with the previously-described upper electrode as a shield such that said dielectric having a high dielectric constant is shaped in the external shape the same as said upper electrode, and that the previously-described upper electrode is shaped by patterning such that it would be in the final shape thereof.

Further, a method of manufacturing a printed wiring board with a capacitor/capacitors pertaining to the present invention includes (a) a step of forming a conductive layer constituting the first electrode (a lower electrode) on the surface of a dielectric layer, (b) a step of forming a dielectric layer by bonding a dielectric material in a sheet form or paste-printing a dielectric material on the surface of the conductor layer constituting the previously-described first electrode (the lower electrode), (c) a step of forming a conductive layer constituting the second electrode (an upper electrode) on the surface of the previously-described dielectric layer, and (d) a step of shaping said dielectric such that the outer periphery portion of the previously-described dielectric layer sits outside the outer periphery portion of the previously-described second electrode.

Further, a method of manufacturing a printed wiring board with a capacitor/capacitors pertaining to the present invention includes (a) a step of laminating a copper foil and a dielectric sheet having a copper foil adhered to one face thereof onto a core substrate via an adhesive layer, (b) a step of forming the second electrode by the copper foil of the previously-described dielectric sheet with a copper foil adhered to one face thereof being patterned by lithography, (c) a step of shaping said dielectric sheet such that the outer periphery portion of the previously-described dielectric sheet sits outside the outer periphery portion of the previously-described second electrode, and (d) a step of forming the first electrode (the lower electrode) by patterning by lithograph the copper foil in contact with the previously-described adhesive layer.

Further, a method of manufacturing a printed wiring board with a capacitor/capacitors pertaining to the present invention includes (a) a step of bonding a dielectric sheet having a copper foil adhered to both faces thereof onto the surface of a interlaminar insulating layer on a core substrate, (b) a step of forming the second electrode by the copper foil, of the previously-described dielectric sheet having a copper foil adhered to both faces thereof, not in contact with the previously-described interlaminar insulating layer being patterned with lithography, (c) a step of shaping said dielectric sheet such that the outer periphery portion of the previously-described dielectric sheet sits outside the outer periphery portion of the previously-described second electrode, and (d) a step of forming the first electrode (the lower electrode) by the copper foil, of the previously-described dielectric sheet having a copper foil adhered to both faces thereof, in contact with the previously-described interlaminar insulating layer being patterned with lithography.

According to the present invention, it can provide a novel printed wiring board provided with a capacitor/capacitors having a good precision capacitance.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A printed wiring board comprising:
   an interlaminar insulating layer;
   a conductive layer formed on the interlaminar insulating layer and having a conductive pattern formed on the interlaminar insulating layer; and
   a capacitor positioned in the interlaminar insulating layer and comprising a dielectric body having a first surface and a second surface, a first electrode provided on the first surface of the dielectric body, and a second electrode provided on the second surface of the dielectric body,
   wherein the first electrode has an area facing and being smaller than the first surface of the dielectric body, the second electrode has an area facing and being larger than the second surface of the dielectric body such that the second electrode has an outer periphery portion protruding from an outer periphery portion of the dielectric body, the interlaminar insulating layer has a first opening extending to the first electrode of the capacitor and a second opening extending to the outer periphery portion of the second electrode of the capacitor, and the conductive layer has a first conductive portion formed in the first opening and connecting the first electrode to the conductive pattern and a second conductive portion formed in the second opening and connecting the second electrode to the conductive pattern.

2. A printed wiring board as set forth in claim 1, wherein the area of the first electrode is not greater than 95% of the first surface of the dielectric body and the area of the second electrode is 105 to 150% of the second surface of the dielectric body.

3. A printed wiring board as set forth in claim 1, wherein the dielectric body is made of a dielectric material comprising at least one of $BaTiO_3$ and $SrTiO_2$.

4. A printed wiring board as set forth in claim 1, wherein the first electrode and second electrode are absent of damage incurred to outer periphery portions of the first electrode and second electrode.

5. A printed wiring board as set forth in claim 1, wherein at least one of the first electrode and second electrode is shaped by patterning.

6. A printed wiring board as set forth in claim 1, further comprising a core layer and a build-up layer, wherein the capacitor is formed on the core layer, and the interlaminar insulating layer is formed in the build-up layer.

7. A printed wiring board as set forth in claim 1, further comprising a core layer and a build-up layer, wherein the interlaminar insulating layer is formed in the build-up layer, and the capacitor is formed on the build-up layer.

8. A printed wiring board as set forth in claim 1, further comprising:
   a core layer on which the interlaminar insulating layer is formed;
   a first build-up layer formed on the interlaminar insulating layer; and
   a plurality of second build-up layers formed on the core layer on an opposite side of the core layer with respect to the interlaminar insulating layer and the first build-up layer,
   wherein the capacitor is formed on the core layer, and the plurality of second build-up layers comprises a plurality of second interlaminar insulating layers and has a plurality of second conductive layers, respectively.

9. A printed wiring board as set forth in claim 1, further comprising:
   a core layer on which the interlaminar insulating layer is formed; and
   a build-up layer formed on the interlaminar insulating layer,
   wherein the build-up layer has a conductive layer, and the interlaminar insulating layer and the build-up layer have a plurality of via conductors formed in the interlaminar insulating and the build-up layer, respectively, and connecting the conductive layers through the interlaminar insulating and the build-up layer.

10. A printed wiring board as set forth in claim 1, wherein the area of the first electrode is not greater than 95% of the first surface of the dielectric body and the area of the second electrode is 105 to 150% of the second surface of the dielectric body, and the dielectric body is made of a dielectric material comprising at least one of $BaTiO_3$ and $SrTiO_2$.

11. A printed wiring board as set forth in claim 1, wherein the dielectric body is made of a dielectric material comprising $BaTiO_3$.

12. A printed wiring board as set forth in claim 1, wherein the dielectric body is made of a dielectric material comprising $SrTiO_2$.

13. A printed wiring board as set forth in claim 1, wherein the dielectric body is made of a dielectric material comprising $BaTiO_3$ and $SrTiO_2$.

14. A printed wiring board as set forth in claim 1, further comprising a core layer and a build-up layer, wherein the capacitor is formed on the core layer, and the interlaminar insulating layer is formed in the build-up layer, wherein the area of the first electrode is not greater than 95% of the first surface of the dielectric body and the area of the second electrode is 105 to 150% of the second surface of the dielectric body.

15. A printed wiring board as set forth in claim 1, further comprising a core layer and a build-up layer, wherein the interlaminar insulating layer is formed in the build-up layer, and the capacitor is formed on the build-up layer, wherein the area of the first electrode is not greater than 95% of the first surface of the dielectric body and the area of the second electrode is 105 to 150% of the second surface of the dielectric body.

16. A printed wiring board as set forth in claim 1, further comprising:
   a core layer on which the interlaminar insulating layer is formed;
   a first build-up layer formed on the interlaminar insulating layer; and
   a plurality of second build-up layers formed on the core layer on an opposite side of the core layer with respect to the interlaminar insulating layer and the first build-up layer,
   wherein the capacitor is formed on the core layer, the second build-up layers comprises a plurality of second interlaminar insulating layers and a plurality of second conductive layers, respectively, and the area of the first electrode is not greater than 95% of the first surface of the dielectric body and the area of the second electrode is 105 to 150% of the second surface of the dielectric body.

17. A printed wiring board as set forth in claim 1, further comprising:
   a core layer on which the interlaminar insulating layer is formed; and
   a build-up layer formed on the interlaminar insulating layer,
   wherein the build-up layer has a conductive layer, the interlaminar insulating layer and the build-up layer have a plurality of via conductors formed in the interlaminar insulating layer and the build-up layer, respectively, and connecting the conductive layers through the interlaminar insulating layer and the build-up layer, and the area of the first electrode is not greater than 95% of the first surface of the dielectric body and the area of the second electrode is 105 to 150% of the second surface of the dielectric body.

18. A printed wiring board as set forth in claim 1, further comprising a core layer and a build-up layer, wherein the capacitor is formed on the core layer, and the interlaminar insulating layer is formed in the build-up layer, wherein the area of the first electrode is not greater than 95% of the first surface of the dielectric body and the area of the second electrode is 105 to 150% of the second surface of the dielectric body, and the dielectric body is made of a dielectric material comprising at least one of $BaTiO_3$ and $SrTiO_2$.

19. A printed wiring board as set forth in claim 1, further comprising a core layer and a build-up layer, wherein the interlaminar insulating layer is formed in the build-up layer, and the capacitor is formed on the build-up layer, wherein the area of the first electrode is not greater than 95% of the first surface of the dielectric body and the area of the second electrode is 105 to 150% of the second surface of the dielectric body, and the dielectric body is made of a dielectric material comprising at least one of $BaTiO_3$ and $SrTiO_2$.

20. A printed wiring board as set forth in claim 1, further comprising:
   a core layer on which the interlaminar insulating layer is formed; and
   a build-up layer formed on the interlaminar insulating layer,
   wherein the build-up layer has a conductive layer, the interlaminar insulating layer and the build-up layer have a plurality of via conductors formed in the interlaminar insulating layer and the build-up layer, respectively, and connecting the conductive layers through the interlaminar insulating layer and the build-up layer, the area of the first electrode is not greater than 95% of the first surface of the dielectric body and the area of the second electrode is 105 to 150% of the second surface of the dielectric body, and the dielectric body is made of a dielectric material comprising at least one of $BaTiO_3$ and $SrTiO_2$.

* * * * *